United States Patent [19]
Clark, II et al.

[11] Patent Number: 5,774,403
[45] Date of Patent: Jun. 30, 1998

[54] PVT SELF ALIGNING INTERNAL DELAY LINE AND METHOD OF OPERATION

[75] Inventors: Airell Clark, II, Albany; Billy E. Thayer, Corvallis; Daryl E. Anderson, Corvallis; Jeffrey A. Hintzman, Corvallis, all of Oreg.

[73] Assignee: Hewlett-Packard, Palo Alto, Calif.

[21] Appl. No.: 873,854

[22] Filed: Jun. 12, 1997

[51] Int. Cl.$^6$ ............................................. G11C 8/00
[52] U.S. Cl. ................................. 365/194; 365/233
[58] Field of Search .................... 365/194, 233, 365/49; 327/149, 150, 164

[56] References Cited

U.S. PATENT DOCUMENTS

| | | | |
|---|---|---|---|
| 3,701,980 | 10/1972 | Mundy | 340/173 AM |
| 4,780,845 | 10/1988 | Threewitt | 365/49 |
| 4,802,136 | 1/1989 | Nose et al. | 365/194 |
| 5,313,438 | 5/1994 | Hieda et al. | 365/238 |
| 5,566,130 | 10/1996 | Durham et al. | 365/233.5 |

*Primary Examiner*—Vu A. Le

[57] ABSTRACT

An integrated circuit process, voltage and temperature fluctuation self-aligning internal delay line circuit and method of operation. A PVT related reference signal is compared to a set of reference signals generated from a system voltage. A delay line is varied based upon the comparison results, generating a delayed timing signal related to PVT fluctuations.

13 Claims, 6 Drawing Sheets

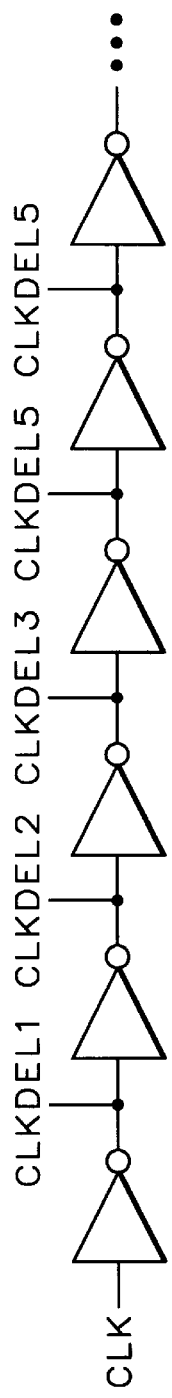
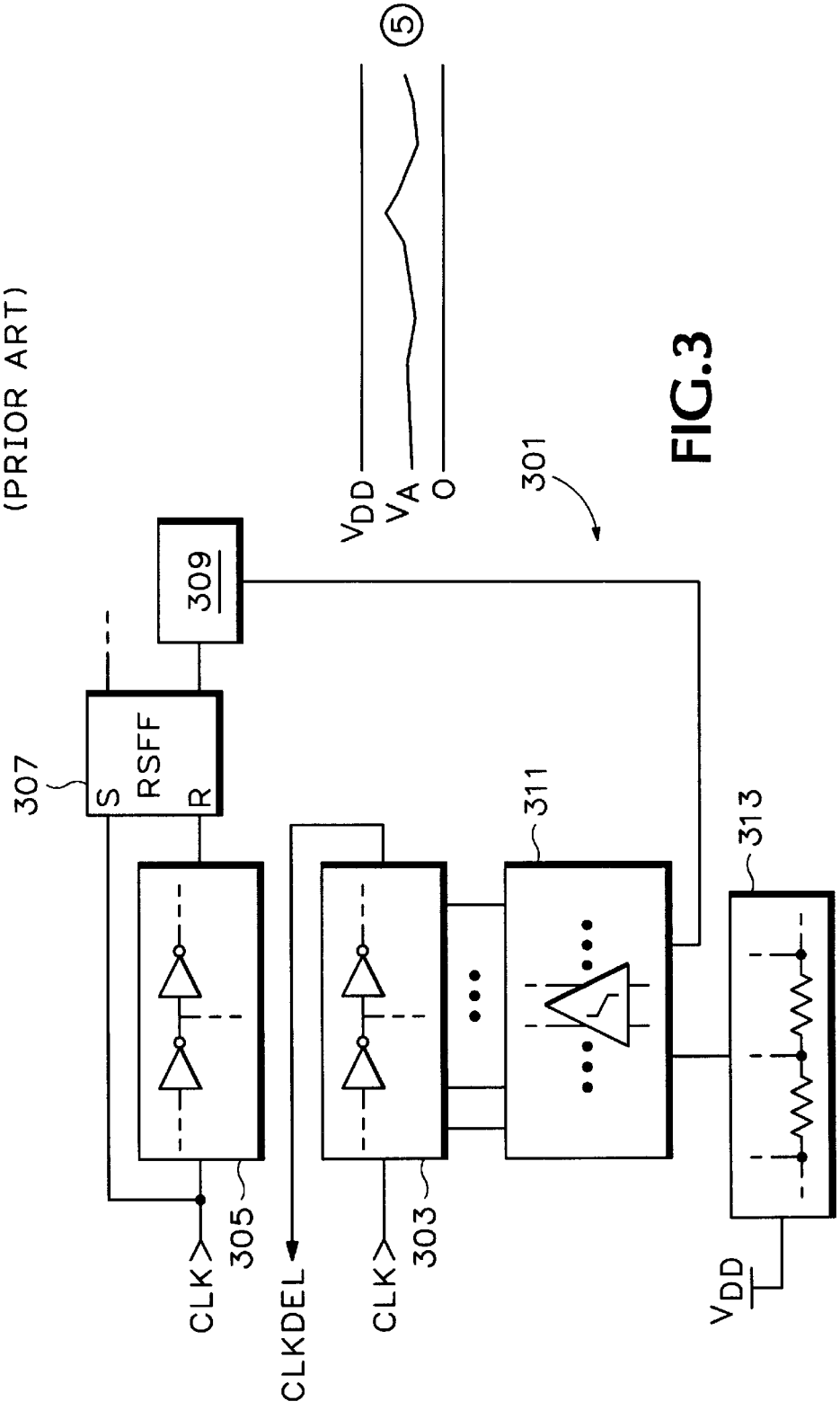

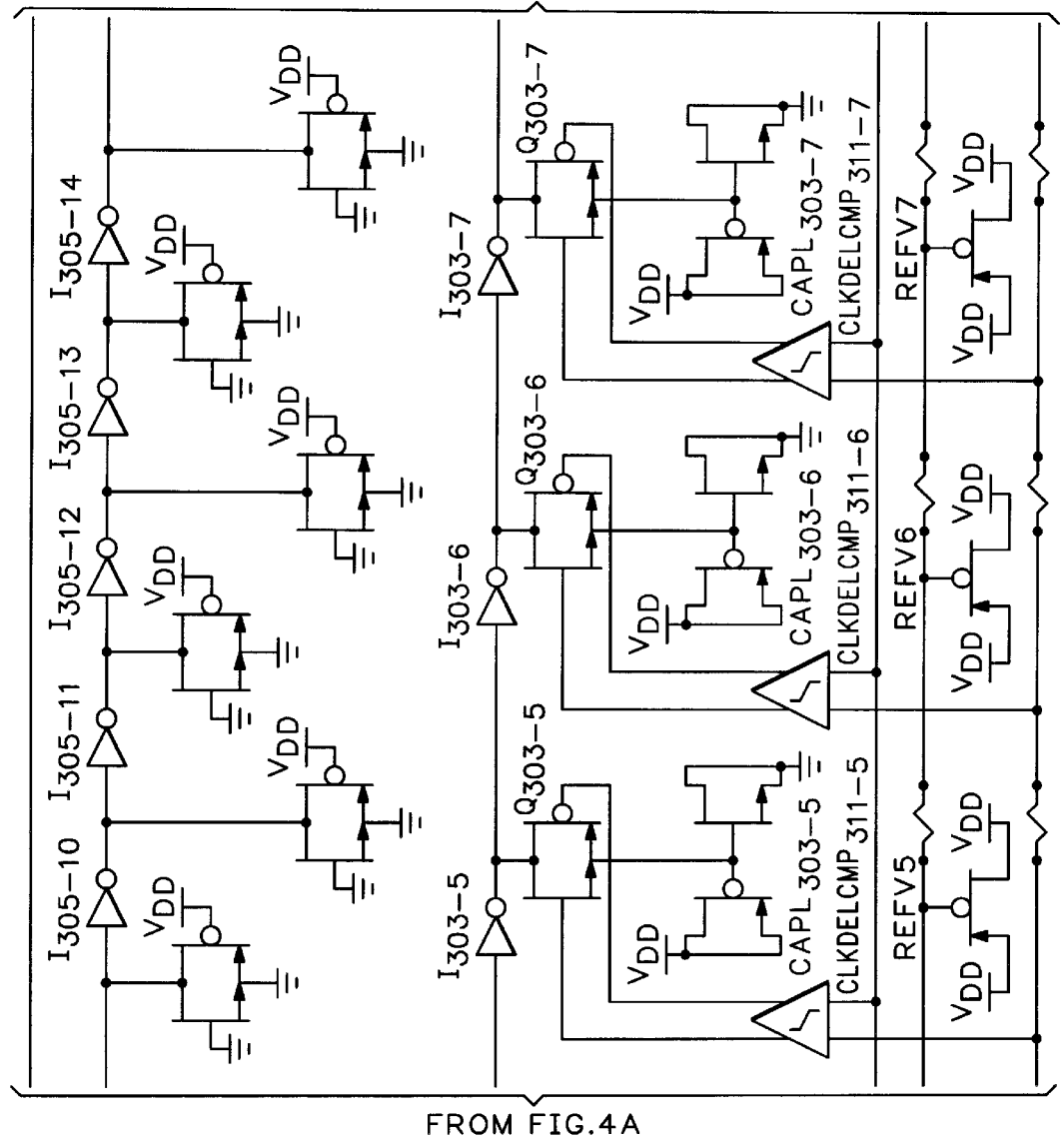

5,774,403

PVT SELF ALIGNING INTERNAL DELAY LINE AND METHOD OF OPERATION

BACKGROUND OF THE INVENTION

1. Field of the Invention

The present invention relates generally to integrated circuits, more specifically to a process, voltage, temperature ("PVT") self-aligning delay line contained within an integrated circuit, and more particularly to such a delay line circuit for megacells using content addressable memory.

2. Description of Related Art

Random access memory ("RAM") is perhaps the most common, available in the state-of-the-art, data storage device made in the form of an integrated circuit (referred to hereinafter as an "IC" or "chip" or "die"). However, RAM devices are not suited for use in systems which process associative data. For example, the well known methodology of sequentially accessing data when addressing the RAM is inefficient for systems involving stored information involving pattern recognition, natural language recognition, sparse matrix processes, data-base interrogation, and the like, where the address associated with the desired stored data may not be known. For this type of data, it is more efficient to interrogate a memory by supplying a compressed subset of the desired data or a code representative of the full data set. The memory responds by signaling either presence or absence of the desired data set and, if present, the data set's associated address within the memory bank.

To accomplish such data storage needs, in the 1980's, another type of memory device was developed to have ambiguous and non-contiguous addressing and was dubbed the content addressable memory, or "CAM" for short. See e.g., U.S. Pat. No. 3,701,980 (Mundy). In essence, for this type of associative data search, the entire CAM array, or "core," can be searched in a single clock cycle, giving it a great advantage over the sequential search technique required when using a RAM device. The input data signal to the CAM would comprise a bit string representation of the data which is being searched for in the CAM. The output would be a signal indicative as to whether the data was found, the MATCH signal, and, if found, the location within the CAM, the MATCH_ADDRESS signal. Obtaining this MATCH and MATCH_ADDRESS information is done with what is called in the art a "match encoder."

The problem with CAM devices is that compared to RAM each individual cell is relatively complex IC structure. See e.g., U.S. Pat. No. 4,780,845 (Threewitt). Thus, for the same chip real estate, a CAM device can not match the density, speed, or low-power performance of a RAM device. Integrated circuit process improvements generally affect both types of devices equally, so that in relative terms, CAM architects can not do much to narrow the performance gap. Moreover, IC fabrication processes which form transistor gates and other circuit devices at the sub-micron size level makes the circuitry performance highly subject to fabrication variances from chip-to-chip, wafer-to-wafer or, at best, die lot-to-die lot. As a result, it is often difficult to attain consistency sufficient for high yield of repeatable performance chips. Moreover, IC performance is also always dependent on actual, real-time, operating temperature and system voltage tolerances. Thus, fabrication process variances, operating voltage tolerances, and operating temperature dependence ("PVT") variations are all a problem to critical logic timing. Therefore, logic timing is generally based on the slowest PVT performance case. Furthermore, attempting to fix these problems internally to an IC by incorporating a use-related delay line is inappropriate since the internal fix would also vary from chip-to-chip, wafer-to-wafer, die lot-to-die lot for the same reasons. These problems are particularly egregious when a CAM is part of a standardized IC intended for broad use, or a large block of logic with a specific function—generally referred to as a "megacell"—intended to be included as part of a larger chip, e.g., an application specific integrated circuit ("ASIC").

Logic timing is critical in IC performance and coordinated by system CLOCK ("CLK") signals and system DELAYED CLOCK ("CLKDEL") signals. If a delay line is built into an IC, PVT dependencies will generally only allow a ±50%, −30% tolerance. In a CAM device, since a complete core cell array access is accomplished during one clock cycle, this is unacceptable.

In the prior art, it is known to fix timing problems caused by PVT variations by adding external reference delay lines to the IC as needed. However, this requires use of at least one input/output pin of the chip. Moreover, where the chip is a generic megacell and the end use system design is an unknown, such a fix is meaningless or, at best, a major problem for the system designer wanting to use the megacell.

Another solution would be to add a second clock to the system. This would require another input pin or use substantial on-board chip real estate for a ring oscillator or some other known clocking device.

Thus, there is a need for a timing delay line which is PVT self-aligning and which can be implemented in an IC without an external reference circuit.

SUMMARY OF THE INVENTION

In its basic aspects, the present invention provides a method for generating a PVT self-aligning delayed clock signal within an integrated circuit, the integrated circuit having a predetermined system voltage signal and a predetermined system clock signal. The method includes the steps of: dividing the system voltage into a series of reference signals; generating a PVT related first delayed clock signal from the system clock signal; generating a second delayed clock signal from the system clock signal; using the system clock signal and the first delayed clock signal, generating a signal indicative of system performance variations due to PVT effects; comparing the signal indicative of system performance variations due to PVT effects to the series of reference signals; based upon results of the step of comparing, dynamically changing the second delayed clock signal to maintain a substantially constant delay between the system clock signal and the second delayed clock signal; and outputting the second delayed clock signal as the PVT self-aligning delayed clock signal.

In another basic aspect the present invention provides a PVT self-aligning delayed-signal generating circuit device, having a predetermined system voltage signal input and a predetermined system timing signal input. The device includes: first delay means for receiving the system timing signal and for transmitting a first delayed-signal; connected to the first delay means, first means for comparing the first delayed-signal to the system timing signal and for resultantly transmitting a signal indicative of variances of system performance due to PVT factors; connected to the first delay means, second means for comparing a series of reference signals directly related to the system voltage signal to the signal indicative of variances of system performance; and connected to the system timing signal, second delay means for generating dynamically a PVT self-aligning delayed-signal, the second delay means is connected to the second means for comparing such that the means for comparing changes the system timing signal into the PVT self-aligning delayed-signal by dynamically changing a length of delay introduced into the system timing signal by the second delay means in accordance with comparison of respective the reference signals to the signal indicative of variances of system performance due to PVT factors, the second delay means having an output for transmitting the PVT self-aligning delayed-signal.

In another basic aspect, the present invention provides a PVT self-aligning delayed-clock signal generating circuit device for an integrated circuit chip system having a system clock signal and a system voltage, application specific combinatorial logic circuitry, and at least one CAM. The circuit device includes: a first delay line, having an input for receiving the clock signal and a delay line output for transmitting a first delayed clock signal, wherein the first delayed clock signal is PVT variation related; a flip-flop, having a first input for receiving the clock signal and a second input for receiving the first delayed clock signal, and a flip-flop output for transmitting a pulse having a duration equal to a difference between time of receipt of the clock signal and time of receipt of the first delayed clock signal; an averager circuit, having an input for receiving the pulse, for generating an averager output signal indicative of average voltage variance due to PVT factor changes, and an averager output for transmitting the averager output signal; a voltage divider having an input connected to the system voltage signal and a series of reference output signals; a plurality of comparators, each of the comparators having a first input connected to one of the series of voltage divider outputs for receiving a reference output signal, and having a second input connected to the averager output for receiving an averager output signal, and having a comparator output for providing a respective comparator output signal indicative of results of comparing the respective reference output signal to the averager output signal; and a second delay line, having a first input connected to the system clock signal, and having a plurality of loads adapted to be added dynamically in order to change length of delay provided by the second delay line, and having a plurality of second inputs connected respectively to a comparator output such that comparator output signals determine how many loads are added based on a comparison of reference output signals to the averager output signal, and having an output for transmitting a resultant the PVT self-aligning delayed-clock signal.

It is an advantage of the present invention that it provides a PVT self-aligning delay line.

It is advantage of the present invention that it provides an IC delay line having a very tight tolerance, providing a negligible variation of delay.

It is another advantage of the present invention that it provides a self-contained IC delay line for a megacell where an input/output interface is eliminated.

It is yet another advantage of the present invention that it provides a PVT delay line for an IC without the need of an external reference.

It is another advantage of the present invention that it can be adapted for any IC system requiring a substantially constant delayed clock signal transition.

It is still another advantage of the present invention that it can be adapted for any frequency input clock.

It is still another advantage of the present invention that it can be adapted to any IC fabrication process.

Other objects, features and advantages of the present invention will become apparent upon consideration of the following explanation and the accompanying drawings, in which like reference designations represent like features throughout the drawings.

BRIEF DESCRIPTION OF THE DRAWINGS

FIG. 2 (Prior Art) depicts a common timing delay line.

FIG. 3 is a schematic block diagram of the present invention.

FIGS. 4A–C are a detail circuit diagram of an exemplary embodiment of the present invention as shown in FIG. 3.

The drawings referred to in this specification should be understood as not being drawn to scale except if specifically noted.

DESCRIPTION OF THE PREFERRED EMBODIMENT

Reference is made now in detail to a specific embodiment of the present invention, which illustrates the best mode presently contemplated by the inventors for practicing the invention. Alternative embodiments are also briefly described as applicable. It will be recognized by a person skilled in the art that the exemplary embodiment is not intended as an only implementation for which this invention is intended or useful; no such limitation on the scope of the invention should be implied.

Figure 1:
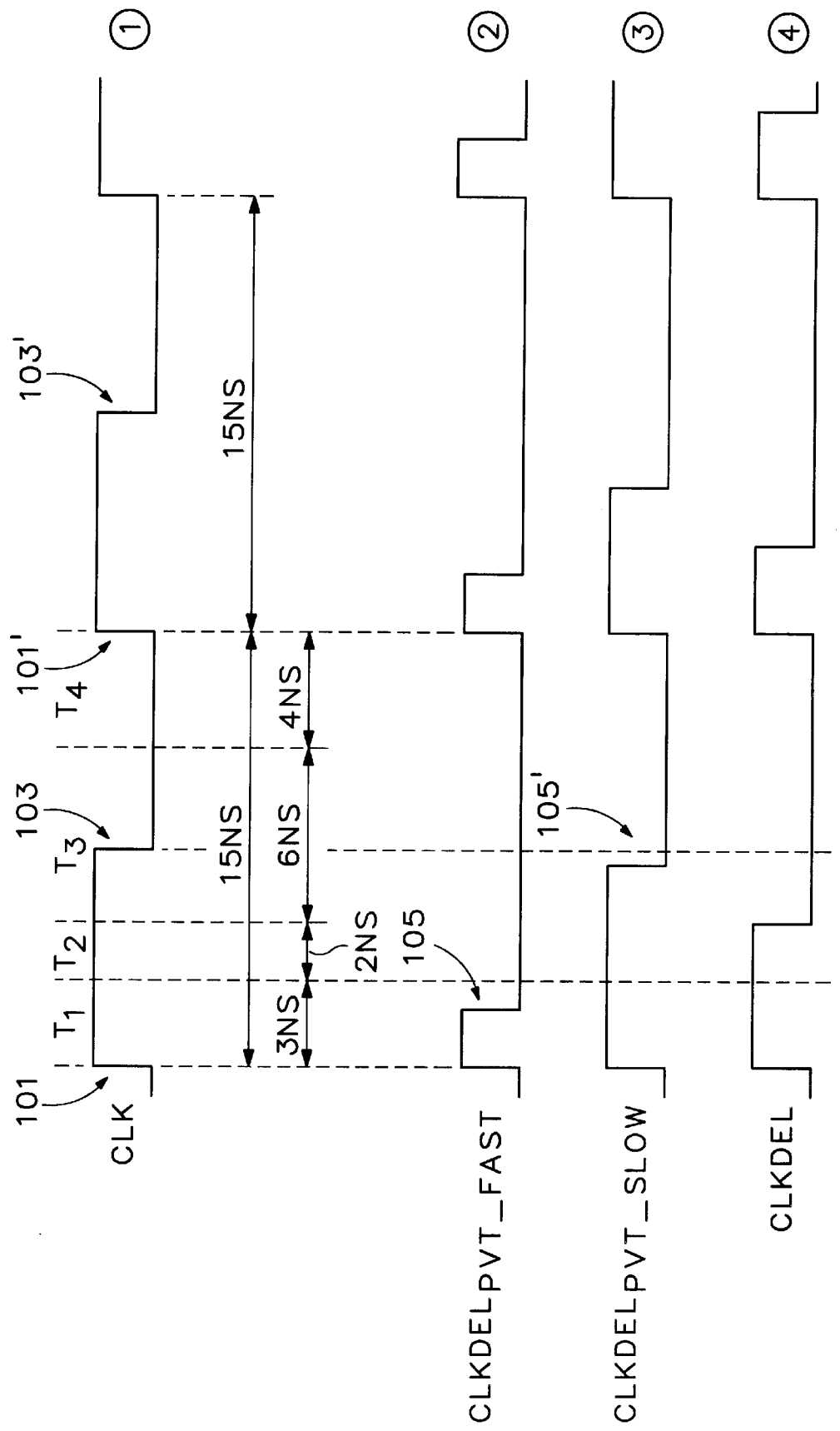
FIG. 1 is a signal diagram depicting a timing problem for a CAM device.

As shown in FIG. 1, waveform circle-1, a system clock for an IC chip provides a basic timing signal, CLK, for the logic circuitry. In this example, the clock is 66 MHZ (approximately a 15-nanosecond cycle). Generally, an off-chip crystal oscillator provides the signal to an input pin of the chip. Combinatorial logic of the IC generally can trigger off the rising edge 101 and falling edge 103 of the CLK signal. However, it is sometimes necessary to have delayed clock signals in order to properly sequence all of the functions of the IC without contentions, interference, or other problems which could result in logic failure. It is common in the art to provide a simple, external delay line device as shown in FIG. 2 to generate various delayed clock trigger signals, $CLKDEL_1$ - - - $CLKDEL_N$, which can be input on other input pins of the chip as needed.

Returning to FIG. 1, as an example, assume that the rising edge 101 of the CLK signal is used to start standard combinatorial logic output on-board a chip having a CAM core or a megacell including a CAM core, e.g., a data compression megacell included as part of an ASIC. Assume further that the logic output is a signal indicative of a CAM search request, SEARCH_ENABLE, and the code of the data sought in the cam core. Assume also that 3-nanoseconds, $T_1$, of a clock cycle are required for complete logic functionality and signal output. Note again that the speed of the logic output is PVT dependent.

During the remainder of the clock cycle, time must be budgeted for the CAM search, the CAM output, and for setting up the combinatorial logic for the next action and output at the next CLK signal transition, rising edge 101', when the cycle repeats. If the standard logic also needs an operational setup budget of 4-nanoseconds, $T_4$, then 8-nanoseconds of the 15-nanosecond clock cycle are left for CAM operations. If the CAM only required 3.5-nanoseconds for a complete search and output, then the falling edge 103 of the CLK signal could be used as a trigger. However, this is generally an insufficient time period for the CAM to search an entire cell array and output the match/no-match and match address signal results. Assuming an exemplary CAM operation requires 2-nanoseconds, $T_2$, for setting up signal receipt and processing of a combinatorial logic SEARCH_ENABLE output and 6-nanoseconds, $T_3$, for the actual search and CAM output, a CLKDEL signal falling edge is necessary 5-nanoseconds ($T_1+T_2$) after the rising edge 101 to trigger the CAM operation.

Looking to FIG. 1, waveforms circle-two and circle-three, assuming a falling edge of CLKDEL is used as a trigger. If the standard delay line as shown in FIG. 2 was built into the IC, PVT dependencies will cause a wide variance of the timing of the $CLKDEL_{PVT}$ falling edge 105. When a PVT_FAST condition exists, the falling edge 105 might come at 2-nanoseconds after CLK signal leading edges 101, 101', et seq., meaning that the combinatorial logic has not yet finished its output search request data that the CAM needs and a failure can occur. When a PVT_SLOW condition exists, the falling edge 105' might come at 7-nanoseconds after CLK signal leading edges 101, 101', et seq., meaning that the CAM will not yet have put up its output results that the combinatorial logic needs at the start of $T_4$ and, again, a failure can occur. Where a timing budget such as the above example leaves zero margin for the CAM cycle, this is clearly unacceptable. Entire die lots might fail post-fabrication testing; individual chips might be subject to temperature excursion failures. Note that this same reasoning holds true for any input cell of an IC that uses a CLKDEL signal transition as a trigger and requires a timing budget to provide a related output and thus it is not just the exemplary CAM implementation.

Figure 4A:
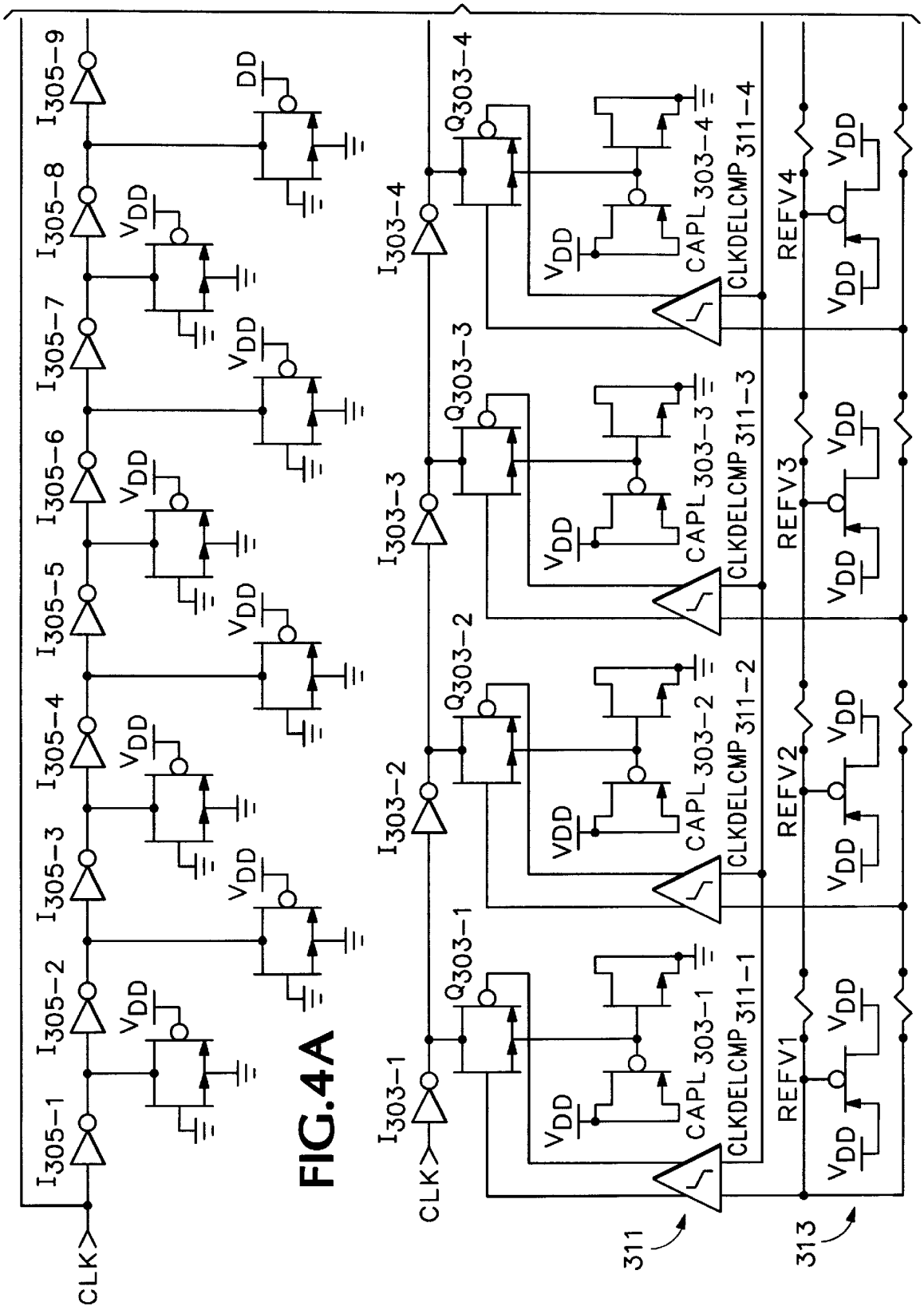
Figure 4C:
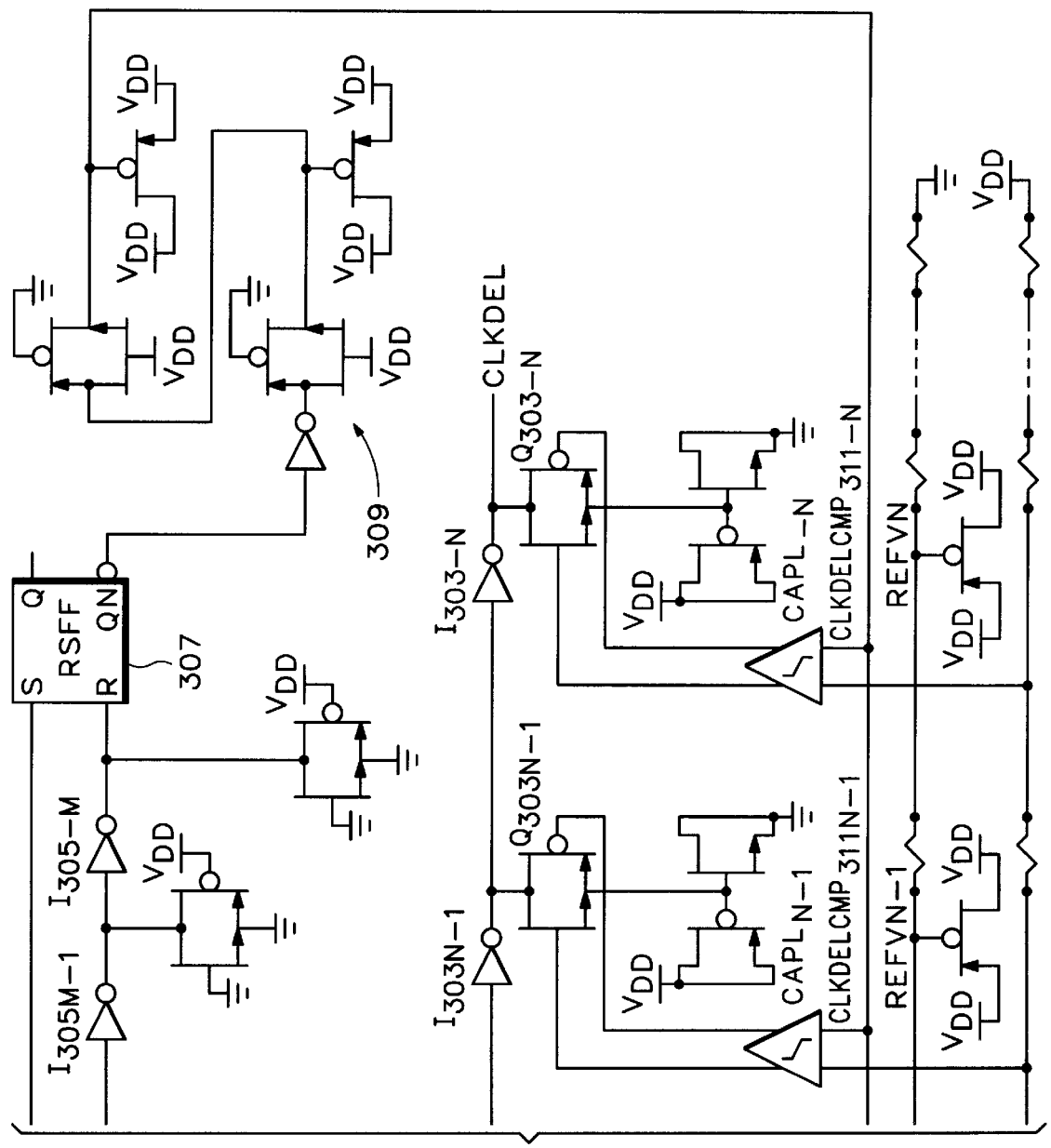

As shown in FIGS. 3 and 4, a PVT-independent, on-chip, PVT self-aligning, delay line circuit 301 In accordance with the present invention provides a substantially constant trigger edge as shown in FIG. 1, waveform circle-4. A first inverter string delay line 303 receives the CLK signal. The speed of a signal from one inverter, $I_{303-1}$–$I_{303-N}$, to the next is dependent on the transistor sizes chosen for a particular implementation, how much load is on each, and on PVT. Process and temperature are not controllable, therefore each inverter $I_{303-1}$–$I_{303-N}$ is provided with a capacitive load $CAPL_{303-1}$–$CAPL_{303-N}$ that can be turned ON and OFF with a pair of transistors $Q_{303-1}$–$Q_{303-N}$. The number, N, of the string is a function of the delay requirement of the specific implementation. In the FIG. 4 implementation, there are thus ten different states, performance curves, which will be generated depending on which loads are ON and which are OFF in the inverter string sequence, viz., from none ON to all nine ON. That is, in accordance with the present invention, as the PVT performance speeds up, loads are added to shift the delay outwardly in time. In other words, in a fast process chip, or as supply voltage goes up, or as temperature falls, loads will be turned ON automatically—and conversely, OFF—and dynamically (in real time) as explained hereinafter.

A second inverter string delay line 305 is provided. The transistor sizes of the inverter string delay lines 303, 305 are identical. The second inverter string, $I_{305-1}$–$I_{305-M}$, delay line 305 receives the CLK signal which is simultaneously provided as an input to an edge-triggered flip-flop 307, a Reset/Set Flip-Flop, "RSFF," which will act as a pulse generator, providing a pulse train that is related to PVT fluctuations for all the reasons stated herein above. The leading edge 101, FIG. 1, of the CLK signal will SET the RSFF 307. The second delay line 305 will delay the CLK input signal for a predetermined time which will then RESET the RSFF 307.

Returning briefly to FIG. 1, the pulse output of the RSFF 307 will appear to be as in waveform circle-2 when PVT is fast and as in waveform circle-3 when PVT is slow. Thus, the RSFF 307 output is PVT related, that is dependent on fluctuations in PVT factors.

Next, this signal is used to select how many inverter loads of the first string 303 are activated—i.e., how many loads should be ON—to automatically and dynamically adjust the CLKDEL signal output. The faster the RESET, the more loads that are required to move the trailing edge of the CLKDEL signal outward to the desired specification trigger time; in the current example to 5.0 nanoseconds after the CLK signal transition.

In an alternative embodiment, it is possible to have some loads ON at the target specification for CLKDEL and if a die or die lot is too slow, loads are turned OFF automatically and dynamically, assuming margins in T1+T2 and T3+T4 (or other logic timing requirements of the specific implementation) permit. For example, an implementation may employ a number of loads on based upon a midpoint of a range of fluctuations expected due to PVT factors.

The average voltage, $V_A$, of the PVT dependent RSFF output pulse varies between zero and the system voltage, $V_{DD}$, during a clock cycle also in relation to PVT. That is, in waveform circle-2, $V_A$ will be closer to zero than in waveform circle-3 over one complete clock cycle. The RSFF output pulses are put through a voltage averager circuit 309 and a dynamic, PVT related, voltage $V_A$ is output. The design target in selecting the length of the second inverter string delay line 305 is to make the voltage on P-type device capacitors 308, 310 stay below $V_{DD}+V_{tp}$, where $V_{DD}$ is the system voltage and $V_{tp}$ is the P-type device threshold voltage (e.g., 3.3V 0.9V =2.4 V) as the P-type device capacitance becomes non-linear above this point. Thus, a "safe" target is to make the PVT_SLOW pulse width one-half the system clock period so that $V_A$ voltage is a maximum of less than or equal to ½ $V_D$. Generally, the greater the range of $V_A$, the better the resolution and control available. In other words, the length of the second delay line 305 is a function of a design determination of what will be a slow performance for the specific circuitry of implementation such that an average pulse width is approximately one-half the clock cycle. Capacitance voltage in the shown P-type devices is targeted at approximately less than or equal to half the system voltage, $V_{DD}$.

A signal indicative of $V_A$ is sent to the inputs of a string of comparator circuits 311. Each comparator $CLKDELCOMP_{311-1}$–$CLKDELCOMP_{311-N}$ has its other input connected to a voltage divider 313, using $V_{DD}$ as a standard to generate a plurality of reference voltages. Thus each comparator receives a respective output comparison voltage $REFV_{313-1}$–$REFV_{313-N}$. If an individual comparator INN from the averager 309 is greater than INP from the voltage divider 313, that comparator OUT is low; conversely, if INN is less than INP, OUTB is high. Each OUTB that is high, if any, turns on a load of the respective first delay line 303 connected to that comparator. With PVT dependent $V_A$ fluctuations as shown in FIG. 3, waveform circle-5, an appropriate number of loads is cut in or out dynamically in order to keep CLKDEL substantially constant at the predetermined design time, namely the start of $T_3$, FIG. 1, waveform circle-1. Thus, a dynamic PVT-aligned tuning of delay line 303 is provided.

Figure 5:
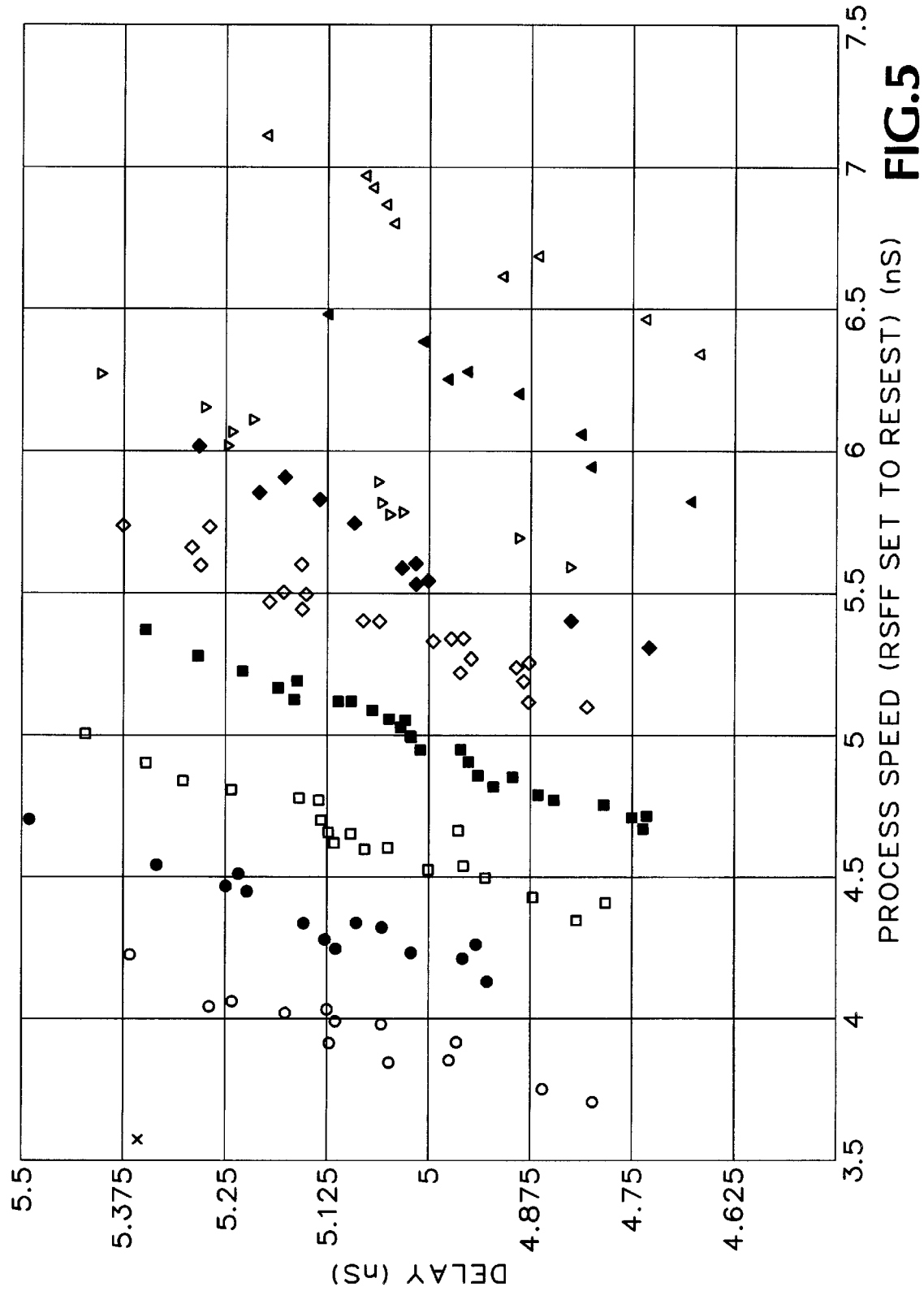
FIG. 5 is a plot of the clock delay signal generation results in accordance with the present invention as shown in FIG. 4.

FIG. 5 shows the present invention results for a circuit where the desired CLKDEL signal falling edge is to be positioned at 5 nanoseconds after the CLK signal rising edge. The horizontal axis is a PVT dependent RSFF possible fluctuation from 3.5 ns to 7.5 ns. The vertical axis is a range of CLKDEL falling edge fluctuation from 4.5 ns to 5.5 ns. The sets of clustered results shows simulated process points for different number of the loads turned on. On the left is the result with all nine loads turned on; to the far right are the results with no loads turned on. In summary, the present invention provides an automatic and dynamic, PVT self-aligning, clock delay circuit that provides a substantially repeatable delayed clock signal with a variance of only about +10%, −7% over expected PVT fluctuations in a chip.

The foregoing description of the preferred embodiment of the present invention has been presented for purposes of illustration and description. It is not intended to be exhaustive or to limit the invention to the precise form or to exemplary embodiments disclosed. Obviously, many modifications and variations will be apparent to practitioners skilled in this art. For example, while described in an exemplary embodiment for clock timing signals, the present invention is applicable to being adapted for other logic delay signal transformations where PVT fluctuations can affect logic timing. Similarly, any process steps described might be interchangeable with other steps in order to achieve the same result. In circuit operations, it will be recognized that several process steps are happening simultaneously. The embodiment was chosen and described in order to best explain the principles of the invention and its best mode practical application, thereby to enable others skilled in the art to understand the invention for various embodiments and with various modifications as are suited to the particular use or implementation contemplated. It is intended that the scope of the invention be defined by the claims appended hereto and their equivalents.

What is claimed is:

1. A method for generating a PVT self-aligning delayed clock signal within an integrated circuit, said integrated circuit having a predetermined system voltage signal and a predetermined system clock signal, said method comprising the steps of:

dividing said system voltage into a series of reference signals;

generating a PVT related first delayed clock signal from said system clock signal;

generating a second delayed clock signal from said system clock signal;

using said system clock signal and said first delayed clock signal, generating a signal indicative of system performance variations due to PVT effects;

comparing said signal indicative of system performance variations due to PVT effects to said series of reference signals;

based upon results of said step of comparing, dynamically changing said second delayed clock signal to maintain a substantially constant delay between said system clock signal and said second delayed clock signal; and outputting said second delayed clock signal as said PVT self-aligning delayed clock signal.

2. The method as set forth in claim 1, said step of dynamically changing said second delayed clock signal further comprising the steps of:

changing circuit loading in said step generating a second delayed clock signal such that output timing of said second delayed clock signal is increased or decreased respectively with changes in system performance due to PVT effects.

3. The method as set forth in claim 1, said step of generating a signal indicative of system performance variation due to PVT effects further comprising the steps of:

generating a pulse train from said system clock signal and said PVT related first delayed clock signal, averaging timing variations in said pulse train, and outputting a signal indicative of said variations in said pulse train timing.

4. The method as set forth in claim 1, said step of comparing said signal indicative of system performance variations due to PVT effects to said series of reference signals further comprising the steps of:

generating a plurality of reference voltages divided from said system voltage signal, and individually comparing each of said plurality of reference voltages to said signal indicative of system performance variations due to PVT effects.

5. The method as set forth in claim 4, said step of changing circuit loading further comprising the steps of:

dynamically adding or subtracting loads in a circuit for generating said second delayed clock signal such that said second delayed clock signal as said PVT self-aligning delayed clock signal is output dependent upon said step of individually comparing each of said plurality of reference voltages to said signal indicative of system performance variations due to PVT effects.

6. A PVT self-aligning delayed-signal generating circuit device, having a predetermined system voltage signal input and a predetermined system timing signal input, said device comprising:

first delay means for receiving said system timing signal and for transmitting a first delayed-signal;

connected to said first delay means, first means for comparing said first delayed-signal to said system timing signal and for resultantly transmitting a signal indicative of variances of system performance due to PVT factors;

connected to said first delay means, second means for comparing a series of reference signals directly related to said system voltage signal to said signal indicative of variances of system performance; and connected to said system timing signal, second delay means for generating dynamically a PVT self-aligning delayed-signal, said second delay means is connected to said second means for comparing such that said means for comparing changes said system timing signal into said PVT self-aligning delayed-signal by dynamically changing a length of delay introduced into said system timing signal by said second delay means in accordance with comparison of respective said reference signals to said signal indicative of variances of system performance due to PVT factors, said second delay means having an output for transmitting said PVT self-aligning delayed-signal.

7. The device as set forth in claim 6, wherein said first delay means for receiving said timing signal and for transmitting a first delayed-signal further comprises:

a first inverter string having a predetermined delay factor determined as a function of slow performance for a specific circuitry of implementation such that an average pulse width is approximately one-half the system timing signal cycle.

8. The device as set forth in claim 7, wherein said first means for comparing further comprises:

a reset/set flip-flop having a first input connected to receive said system timing signal and a second input for receiving said first delayed signal such that said flip-flop generates a series of output pulses on a flip-flop output based upon each delay between receiving said system timing signal and said first delayed signal, and an averager circuit connected to said flip-flop output, having an output providing an averager signal indicative of a voltage level that varies dynamically due to PVT effects.

9. The device as set forth in claim 8, wherein said second means for comparing further comprises:

a plurality of comparators, each comparator having a first input for receiving a reference signal input and a second input for receiving said averager signal output, a voltage divider connected to said system voltage signal and having a plurality of outputs providing a series of reference signals, one each of said outputs is connected respectively to a first input of one of said comparators, and each of said comparators having an output for providing a signal indicative of a comparison result of comparing respectively a reference signal to said averager signal.

10. The device as set forth in claim 9, wherein said second delay means further comprises:

a second inverter string, having a first input for receiving said system timing signal, each inverter of said second inverter string having a load that can be turned on or off and having a second input connected to a respective comparator output for receiving a signal to turn a respective load on or off such that the second inverter string is tuned dynamically by said second means for comparing, creating a variable delay factor in said second inverter string, and said second inverter string having an output transmitting said PVT self-aligning delayed-signal.

11. The device as set forth in claim 10, further comprising:

said first inverter string and said second inverter string are fabricated such that each inverter has substantially identical transistors.

12. The device as set forth in claim 10, further comprising:

said second inverter string having a predetermined number of loads in an on condition when variances of system performance due to PVT factors is at a midpoint of a range of fluctuation of said signal indicative of variances of system performance due to PVT factors.

13. A PVT self-aligning delayed-clock signal generating circuit device for an integrated circuit chip system having a system clock signal and a system voltage, application specific combinatorial logic circuitry, and at least one CAM, said circuit device comprising:

a first delay line, having an input for receiving said clock signal and a delay line output for transmitting a first delayed clock signal, wherein said first delayed clock signal is PVT variation related;

a flip-flop, having a first input for receiving said clock signal and a second input for receiving said first delayed clock signal, and a flip-flop output for transmitting a pulse having a duration equal to a difference between time of receipt of said clock signal and time of receipt of said first delayed clock signal;

an averager circuit, having an input for receiving said pulse, for generating an averager output signal indicative of average voltage variance due to PVT factor changes, and an averager output for transmitting said averager output signal;

a voltage divider having an input connected to said system voltage signal and a series of reference output signals;

a plurality of comparators, each of said comparators having a first input connected to one of the series of voltage divider outputs for receiving a reference output signal, and having a second input connected to said averager output for receiving an averager output signal, and having a comparator output for providing a respective comparator output signal indicative of results of comparing said respective reference output signal to said averager output signal; and a second delay line, having a first input connected to said system clock signal, and having a plurality of loads adapted to be added dynamically in order to change length of delay provided by said second delay line, and having a plurality of second inputs connected respectively to a comparator output such that comparator output signals determine how many loads are added based on a comparison of reference output signals to said averager output signal, and having an output for transmitting a resultant said PVT self-aligning delayed-clock signal.

* * * * *